(12) United States Patent
Luce et al.

(10) Patent No.: US 8,629,036 B2
(45) Date of Patent: *Jan. 14, 2014

(54) INTEGRATED SEMICONDUCTOR DEVICES WITH AMORPHOUS SILICON BEAM, METHODS OF MANUFACTURE AND DESIGN STRUCTURE

(75) Inventors: Stephen E. Luce, Underhill, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 34 days.

This patent is subject to a terminal disclaimer.

(21) Appl. No.: 13/294,615

(22) Filed: Nov. 11, 2011

(65) Prior Publication Data
US 2013/0119491 A1 May 16, 2013

(51) Int. Cl.
*H01L 21/76* (2006.01)
*H01L 21/70* (2006.01)

(52) U.S. Cl.
USPC .......................................... 438/422; 257/522

(58) Field of Classification Search
USPC .................. 438/319, 411, 422, 619; 257/522
See application file for complete search history.

(56) References Cited

U.S. PATENT DOCUMENTS

| | | | |
|---|---|---|---|
| 3,614,678 A | 10/1971 | Engeler et al. | |
| 5,427,975 A | 6/1995 | Sparks et al. | |
| 5,511,427 A | 4/1996 | Burns | |
| 5,834,646 A | 11/1998 | Kvisteroy et al. | |
| 5,985,412 A | 11/1999 | Gosele | |
| 6,079,274 A | 6/2000 | Ando et al. | |
| 6,118,164 A | 9/2000 | Seefeldt et al. | |
| 6,452,238 B1 | 9/2002 | Orcutt et al. | |
| 6,635,509 B1 | 10/2003 | Ouellet | |
| 6,660,564 B2 | 12/2003 | Brady | |
| 6,710,461 B2 | 3/2004 | Chou et al. | |
| 6,902,656 B2 * | 6/2005 | Ouellet et al. | 204/192.16 |
| 7,138,293 B2 | 11/2006 | Ouellet et al. | |
| 7,154,173 B2 | 12/2006 | Ikeda et al. | |
| 7,250,353 B2 | 7/2007 | Nasiri et al. | |
| 7,262,622 B2 | 8/2007 | Zhao | |
| 7,552,645 B2 | 6/2009 | Bargatin et al. | |
| 7,615,845 B1 | 11/2009 | Blixhavn | |
| 7,763,947 B2 | 7/2010 | Zhan et al. | |
| 7,824,098 B2 | 11/2010 | Melamud et al. | |

(Continued)

OTHER PUBLICATIONS

U.S. Appl. No. 13/294,610, filed Nov. 2011, Harame et al.*

(Continued)

*Primary Examiner* — Calvin Lee
(74) *Attorney, Agent, or Firm* — Anthony Canale; Roberts Mlotkowski Safran & Cole, P.C.

(57) ABSTRACT

Bulk acoustic wave filters and/or bulk acoustic resonators integrated with CMOS processes, methods of manufacture and design structures are disclosed. The method includes forming at least one beam comprising amorphous silicon material and providing an insulator material over and adjacent to the amorphous silicon beam. The method further includes forming a via through the insulator material and exposing a material underlying the amorphous silicon beam. The method further includes providing a sacrificial material in the via and over the amorphous silicon beam. The method further includes providing a lid on the sacrificial material and over the insulator material. The method further includes venting, through the lid, the sacrificial material and the underlying material to form an upper cavity above the amorphous silicon beam and a lower cavity below the amorphous silicon beam, respectively.

21 Claims, 10 Drawing Sheets

(56) References Cited

U.S. PATENT DOCUMENTS

| | | |
|---|---|---|
| 7,846,811 B2 | 12/2010 | Villa et al. |
| 2008/0096301 A1 | 4/2008 | Ramamoorthi et al. |
| 2009/0211359 A1 | 8/2009 | O'Mahony et al. |
| 2009/0239313 A1 | 9/2009 | Anemikos et al. |
| 2010/0072626 A1 | 3/2010 | Theuss et al. |
| 2010/0197065 A1 | 8/2010 | Zhan et al. |
| 2011/0109405 A1 | 5/2011 | Buchwalter et al. |
| 2011/0315527 A1* | 12/2011 | Dang et al. .................. 200/181 |
| 2012/0261787 A1 | 10/2012 | Stamper |

OTHER PUBLICATIONS

International Search Report of the International Searching Authority for Application No. PCT/US12/58542, date of mailing—Dec. 17, 2012, 3 pages.

Written Opinion of the International Searching Authority for Application No. PCT/US12/58542, date of mailing—Dec. 17, 2012, 6 pages.

Fedder et al. "Technologies for Cofabricating MEMS and Electronics", Proceedings of the IEEE, col. 96, No. 2, pp. 306-322, Feb. 2008.

J.H. Hales et al. "Longitudinal bulk acoustic mass sensor", DTU Nanotech, 2009, IEEE, pp. 311-314, Technical University of Denmark, Kgs. Lyngby, Denmark.

J. Teva et al. "From VHF to UHF CMOS-MEMS Monolithically Integrated Resonators", Jan. 13-17, 2008, pp. 82-85, Universitat Autonoma de Barcelona, Spain, IEEE.

V. Kaajakari et al. "Nonlinear Limits for Single-Crystal Silicon Microresonators", Journal of Microelectromechanical Systems, pp. 715-724, vol. 13, No. 5, Oct. 2004.

Suni, T. et al., "Direct wafer bonding for MEMS and microelectronics", VTT Publications 609, ESPOO 2006, 94 pages.

"Film Bulk Acoustic Resonator (FBAR)", http://www.coventor.comlmems/applications/FBAR.html, Coventor, retrieved Nov. 11, 2011, pp. 1-3.

"Flim Bulk Acoustic-Wave Resonator (FBAR)", http://mems.usc.edu/fbar.htm, Research Area University of Southern California, retrieved Nov. 11, 2011, pp. 1-3.

* cited by examiner

INTEGRATED SEMICONDUCTOR DEVICES WITH AMORPHOUS SILICON BEAM, METHODS OF MANUFACTURE AND DESIGN STRUCTURE

FIELD OF THE INVENTION

The invention relates to semiconductor structures and methods of manufacture and, more particularly, to bulk acoustic wave filters and/or bulk acoustic resonators integrated with CMOS processes, methods of manufacture and design structures.

BACKGROUND

Bulk Acoustic Wave (BAW) filter and Bulk Acoustic Resonator (BAR) are gaining more popularly for their performance benefits and are being utilized in the design of today's cutting-edge mobile devices and systems. However, due to manufacturing complexities, Bulk Acoustic Wave (BAW) filter and Bulk Acoustic Resonator (BAR) are fabricated as standalone devices. That is, the Bulk Acoustic Wave (BAW) filter and Bulk Acoustic Resonator (BAR) are not provided as integrated structures with other CMOS, BiCMOS, SiGe HBT, and/or passive devices, thus leading to higher manufacturing costs, and increased fabrication processing.

Accordingly, there exists a need in the art to overcome the deficiencies and limitations described hereinabove.

SUMMARY

In a first aspect of the invention, a method comprises forming at least one beam comprising amorphous silicon material and providing an insulator material over and adjacent to the amorphous silicon beam. The method further comprises forming a via through the insulator material and exposing a material underlying the amorphous silicon beam. The method further comprises providing a sacrificial material in the via and over the amorphous silicon beam. The method further comprises providing a lid on the sacrificial material and over the insulator material. The method further comprises venting, through the lid, the sacrificial material and the underlying material to form an upper cavity above the amorphous silicon beam and a lower cavity below the amorphous silicon beam, respectively.

In another aspect of the invention, a method comprising forming a amorphous silicon beam over an SOI substrate and protecting the amorphous silicon beam with an insulator material during cavity formation. The cavity formation comprises forming an upper cavity above the amorphous silicon beam and a lower cavity below the amorphous silicon beam. The upper cavity is formed by venting a sacrificial material formed over the amorphous silicon beam. The lower cavity is formed by venting underlying material, below the amorphous silicon beam through a via connecting the upper cavity and the lower cavity.

In yet another aspect of the invention, a structure comprises an amorphous silicon beam formed on an insulator layer. An upper cavity is formed above the amorphous silicon beam, over a portion of the insulator material, and a lower cavity is formed below the amorphous silicon beam. A connecting via connects the upper cavity to the lower cavity, the connecting via being coated with the insulator material. A Bulk Acoustic Wave (BAW) filter or Bulk Acoustic Resonator (BAR) is on the amorphous silicon beam.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the semiconductor structure, which comprises the structures of the present invention. In still further embodiments, a method in a computer-aided design system is provided for generating a functional design model of the semiconductor structure. The method comprises generating a functional representation of the structural elements of the semiconductor structure.

More specifically, in embodiments of the present invention, a design structure readable by a machine used in design, manufacture, or simulation of an integrated circuit is provided. The design structure comprises: an amorphous silicon beam formed on an insulator layer; an upper cavity formed above the amorphous silicon beam, over a portion of the insulator material; a lower cavity formed below the amorphous silicon beam; a connecting via that connects the upper cavity to the lower cavity, the connecting via being coated with the insulator material; and a Bulk Acoustic Wave (BAW) filter or Bulk Acoustic Resonator (BAR) on the amorphous silicon beam.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIGS. 1-5*a*, 5*b*, and 6-10 show processing steps and related structures in accordance with aspects of the present invention;

DETAILED DESCRIPTION

The invention relates to semiconductor structures and methods of manufacture and, more particularly, to bulk acoustic wave filters and/or bulk acoustic resonators integrated with CMOS devices (and processes), methods of manufacture and design structures. More specifically, the present invention is directed to a Bulk Acoustic Wave (BAW) filter or Bulk Acoustic Resonator (BAR) integrated with a CMOS structure such as, for example, a filter surrounded by an upper cavity and lower cavity. In embodiments, the filter is formed from amorphous silicon or polysilicon material (hereinafter referred to as amorphous silicon). Also, in embodiments, the lower cavity and upper cavity are formed in a single venting step, with the lower cavity formed in either an underlying an underlying semiconductor material, or an insulator material formed above the semiconductor material. The lower cavity and upper cavity can alternatively be formed in separate etching steps. In embodiments, the surface of the filter beam and other devices can be coated in a thin film (e.g., oxide) through an integration process to avoid etching silicon during venting.

Figure 1:
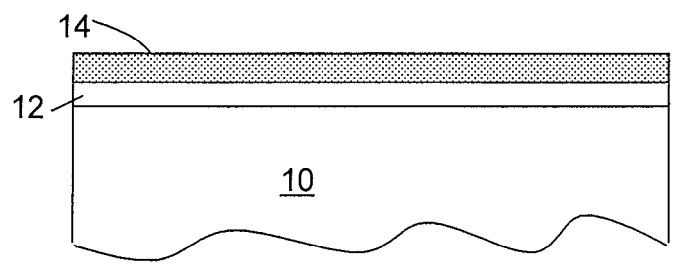

FIG. 1 shows a starting structure in accordance with aspects of the present invention. More specifically, FIG. 1 shows a semiconductor substrate or wafer 10. In embodiments, the wafer 10 may comprise a BULK silicon or silicon on insulator (SOI) implementation. In the SOI wafer implementation, for example, the wafer 10 comprises an active semiconductor layer 14 (e.g., active silicon) formed on an insulation layer 12. The insulator layer 12 is formed on top of the wafer 10. The insulator layer 12 (also referred to as a BOX in the SOI implementation) is formed on a handle wafer (bulk substrate) 10. In embodiments, the active semiconductor layer 14 can have a thickness of about 0.1 to 5 microns and the insulator layer 12 can have a thickness of about 0.1 to 5 microns; although other dimensions are also contemplated by the present invention.

The constituent materials of the SOI wafer or BULK implementation may be selected based on the desired end use application of the semiconductor device. For example, the insulation layer 12, e.g., BOX, may be composed of oxide, such as $SiO_2$. Moreover, the active semiconductor layer 14 can be comprised of various semiconductor materials, such as, for example, Si, SiGe, SiC, SiGeC, etc. The SOI wafer 10 may be fabricated using techniques well known to those skilled in the art. For example, the SOI wafer 10 may be formed by conventional processes including, but not limited to, oxygen implantation (e.g., SIMOX), wafer bonding, etc.

Figure 2:
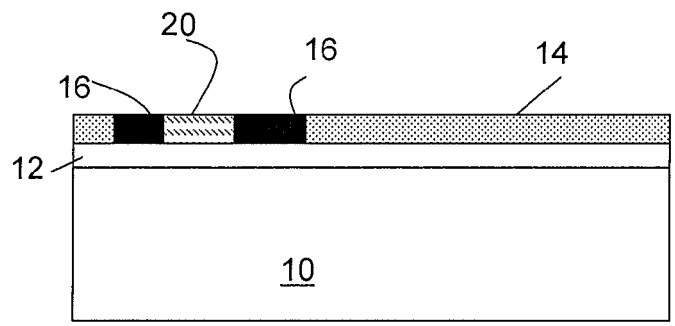

FIG. 2 shows additional processing steps and resultant structure in accordance with aspects of the present invention. For example, FIG. 2 shows the formation of devices 16 (integrated in CMOS processes with a Bulk Acoustic Wave (BAW) filter or Bulk Acoustic Resonator (BAR)). In embodiments, the devices 16 are formed from the active semiconductor layer 14, using conventional lithographic, etching and deposition processes such that further explanation is not required herein. In embodiments, the devices 16 can be, for example, CMOS, BiCMOS, DRAM, FLASH or passive devices formed in the active silicon layer 14. The devices 16 are separated by shallow trench isolation (STI) structures 20, formed by etching the active semiconductor layer 14 and depositing an insulation material such as, for example, oxide, in trenches formed by the etching, followed by a chemical mechanical polish step to planarize the wafer, as known in the art.

Figure 3:
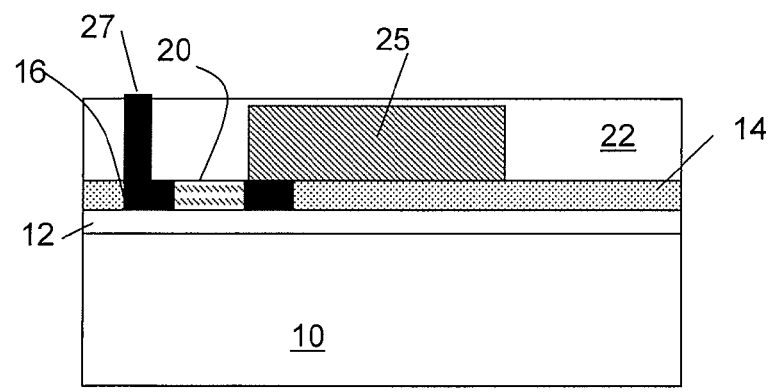

FIG. 3 shows additional processing steps and a related structure in accordance with aspects of the present invention. More specifically, in FIG. 3, a sacrificial material 25 is formed on the active layer 14. The sacrificial material 25 can be a sacrificial silicon material, for example, deposited and patterned using conventional CMOS processes. For example, the sacrificial material can be deposited using a vapor deposition. In more specific embodiments, if silicon is used for the sacrificial material 25, it can be deposited using any conventional deposition process such as, for example, chemical vapor deposition (CVD), plasma-enhanced CVD (PECVD), or physical vapor deposition (PVD). In embodiments, the sacrificial silicon material 25 is a lower cavity silicon. The sacrificial material 25 can be patterned with photoresist, RIE etched using a $SF_6$-based chemistry, and the photoresist removed in an oxygen plasma.

Still referring to FIG. 3, an insulator layer 22 is formed over the devices 16 and STI structures 20, including the sacrificial material 25. In embodiments, the insulator layer 22 is an oxide material, deposited using, for example, a chemical vapor deposition (CVD) process, PECVD, or a thermal oxide deposition process. In embodiments, the insulator layer 22 has a thickness of about 1 micron; although other dimensions are also contemplated by the present invention. In one exemplary embodiment, silicon layer 14 is 0.5 microns thick, as fabricated, and the insulator layer 22 is 2 microns thick. Insulator layer 22 would be planarized using conventional methods, such as CMP or reverse-damascene planarization, as is known in the art.

In alternative embodiments, the insulator layer 22 can be patterned and etched using conventional CMOS processes, and the sacrificial material 25 can be deposited within the pattern. In this alternative embodiment, a thin insulator layer would then be formed over the sacrificial material. In embodiments, the thin insulator layer would be about 1 to 2 microns in thickness; although other dimensions are also contemplated by the present invention. It should be understood by those of skill in the art that, in all embodiments, a layer of insulator 22 can be left over the amorphous silicon layer. This layer of insulator 22 would have thickness ranging roughly from 0.1 to 3 microns, for example.

A metal or metal alloy interconnect 27 is formed in contact with one or more of the devices 16. The interconnect 27 can be formed in any conventional CMOS process. For example, a mask can be formed on the insulator material 22, and exposed to light to form a pattern. An etching process can then be performed, to form a pattern (opening) in the insulator material 22 to the device 16. The pattern (opening) is then filled with a metal or metal alloy such as, for example, a aluminum based material. In embodiments, the interconnect 27 can be a damascene tapered stud contact or via.

Figure 4:
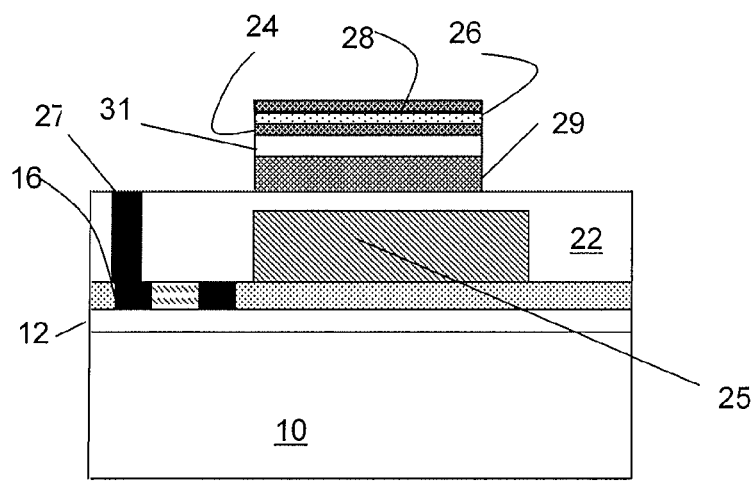

In FIG. 4, amorphous silicon 29 is deposited on the insulator material 22. In embodiments, the amorphous silicon 29 can be deposited using any conventional chemical vapor deposition (CVD) or plasma vapor deposition (PVD) process. In embodiments, the amorphous silicon 29 can be deposited to a depth of about 1 to 5 microns; although other dimensions are also contemplated by the present invention. In embodiments, the insulator material 22 between the sacrificial material 25 and the amorphous silicon 29 can be about 1 to 2 microns; although other dimensions are also contemplated by the present invention.

Still referring to FIG. 4, an insulator layer 31 is deposited on the amorphous silicon 29. A metal layer 24 is formed on the insulator layer 22. A piezoelectric transducer (PZT) film 26 is formed on the metal layer 24. The PZT film 26 can be, for example, aluminum nitride, or other known PZT materials. The PZT film 26 can be used to generate and/or sense an acoustic wave. In this way, the PZT film 26 can be used to integrate a Bulk Acoustic Wave (BAW) filter or Bulk Acoustic Resonator (BAR) in a CMOS process/structure such as, for example, a filter surrounded by an upper cavity and lower cavity (as described further below). A metal layer 28 is formed on the PZT film 26.

In embodiments, the metal layers 24, 28 can be, for example, any conductor materials including one or more of, for example, titanium, titanium nitride, tungsten, molybdenum aluminum, aluminum-copper, and similar type of materials know to those of skill in the art. In embodiments, the metal layers 24, 28 and the PZT film 26 are deposited using conventional deposition processes. In embodiments, the metal layers (e.g., conductor layers) 24, 28 can employ the same thickness and materials so that they are symmetric.

As further shown in FIG. 4, the amorphous silicon 29, insulator layer 31, metal layers 24, 28 and the PZT film 26 are patterned using conventional photolithography and etching techniques. For example, a resist can be deposited on the metal layer 28, which is then exposed to light to form a pattern (openings). The amorphous silicon 29, insulator layer 31, metal layers 24, 28 and the PZT film 26 can then be etched through the openings using conventional etching chemistries such as, for example, reactive ion etching (RIE) processes. In embodiments, the metal layers 24, 28 and the PZT film 26 will remain, above, e.g., aligned with, at least the amorphous silicon 29 (which will form the beam of the present invention) and, in embodiments, one or more devices 16. The resist can then be removed using conventional stripping processes such as, for example, conventional ashing processes. The exposed portions of the layers 24, 26, 28, 29, 31 can be coated with an optional oxide layer.

Figure 5A:
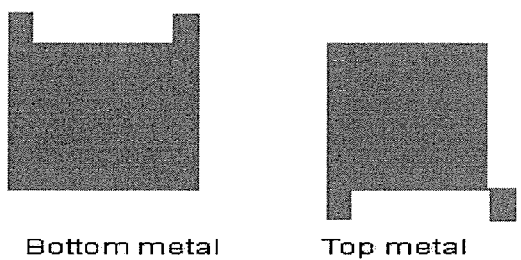
Figure 5B:
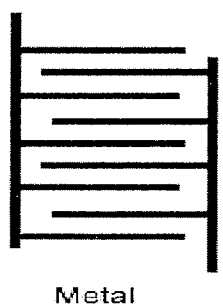

Acoustic wave devices can be fabricated either in a metal-piezoelectric film (PZT)-metal process or in a metal-PZT process. For the metal-PZT-metal embodiment, the acoustic waves are excited vertically between the two metal plates. For the metal-PZT embodiment, the acoustic waves are excited laterally between a comb-finger structure in the metal. In FIGS. 5a and 5b, simplified top view drawings are shown of vertical (FIG. 5a) and lateral (FIG. 5b) bulk acoustic wave filters. FIG. 5a shows simplified top view layouts of the layer 24 (bottom metal) and layer 28 (top metal) in FIG. 4 for a vertical acoustic wave filter. FIG. 5b shows a simplified top view of a lateral bulk acoustic wave filter structure, wherein only layer 28 is used for form the filter and layer 24 can either be omitted or used for other purposes, such as a ground plane. The discussion below is limited to the metal-PZT-metal embodiment, although either embodiment is applicable for purposes of discussion.

Figure 6:
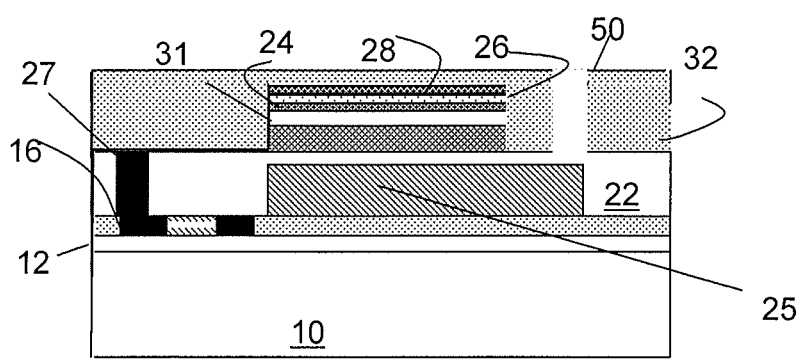

FIG. 6 shows additional processing steps and related structures in accordance with aspects of the present invention. More specifically, FIG. 6 shows deposition of an insulator material 32, e.g., oxide. In embodiments, the insulator material 32 can be an oxide material, deposited using, for example, high density plasma or plasma enhanced high density plasma processes, atomic layer deposition (ALD), PECVD, or liquid phase chemical vapor deposition (CVD) processes. As shown in FIG. 6, the insulator material 32 is deposited over the exposed layers 29, 31, 24, 26 and 28.

The insulator material 32 can be planarized using a conventional CMP or reverse-damascene process as shown, for example, in U.S. application Ser. No. 12/974,854, filed on Dec. 21, 2010, the contents of which are incorporated by reference herein. A pattern or opening 50 is formed in the insulator material 32, on a side of the layers 29, 31, 24, 26 and 28. The pattern or opening 50 is formed in a conventional manner, as described herein. The pattern or opening 50 exposes a portion of the underlying sacrificial material 25. In embodiments, the insulator material 32 remains on the amorphous silicon beam 29, insulator layer 31, metal layers 24, 28 and PZT film 26, as well as over the devices 16. Even more specifically, in embodiments, the insulator material 32 remains on all exposed surfaces of the beam 44 to, e.g., prevent sacrificial silicon reaction with the PZT film 26, as well as any exposed surfaces of the beam structure. In embodiments, the insulator material 32 prevents an AlN reaction with the sacrificial silicon material used to form the cavity above the filter. The insulator material 32 also protects the amorphous silicon beam 29 from being vented or removed during the subsequent silicon cavity venting etch process. In embodiments, the cavity via 50 is about a five (5) micron wide via, which will connect an upper cavity to a lower cavity, in subsequent cavity formation processing steps.

Figure 7:
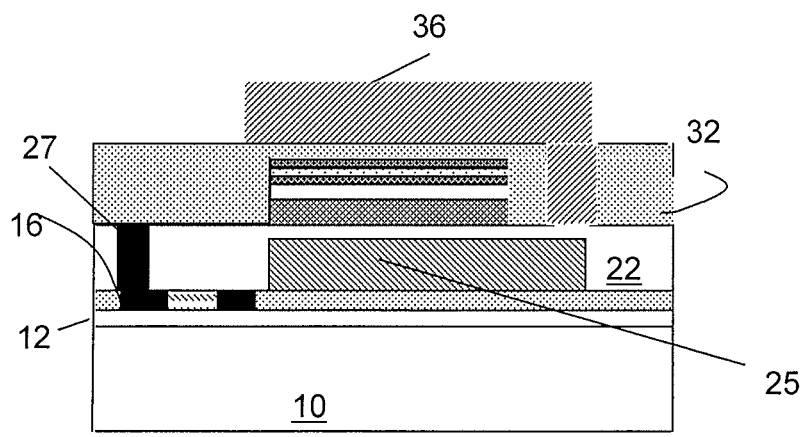

In FIG. 7, a sacrificial material deposition 36 is provided in the via 50 and on the insulator material 32, including above the metal layer 28. A clean, such as 100:1 HF, would be used prior to layer 36 deposition to remove the native oxide from the surface of layer 25 in the bottom of via 50. Next, the sacrificial material 36 is patterned and etched, as is known in the art. For example, if silicon is used for the sacrificial material 36, it would be patterned with photoresist, the silicon would be RIE etched using a $SF_6$-based chemistry, and the photoresist would be removed in an oxygen plasma. In embodiments, the sacrificial material 36 is a sacrificial silicon material, which can be deposited using any conventional deposition process such as, for example, chemical vapor deposition (CVD) or physical vapor deposition (PVD). In embodiments, the sacrificial silicon material 36 is an upper cavity silicon. In embodiments, the sacrificial silicon material 36 is deposited without oxidized voids or seams in the opening (cavities) 50.

Oxidized voids are seams or keyholes or pinched off openings in the silicon formed over openings wherein the sides of the seams or keyholes are coated in silicon dioxide, which will not be vented or removed during the subsequent silicon venting step and would leave residuals inside the cavity. Alternatively, the sacrificial material would be deposited without any voids or keyholes over topography, as known in the art. Other materials which can be vented, such as germanium (Ge) could be used in place of silicon.

Figure 8:
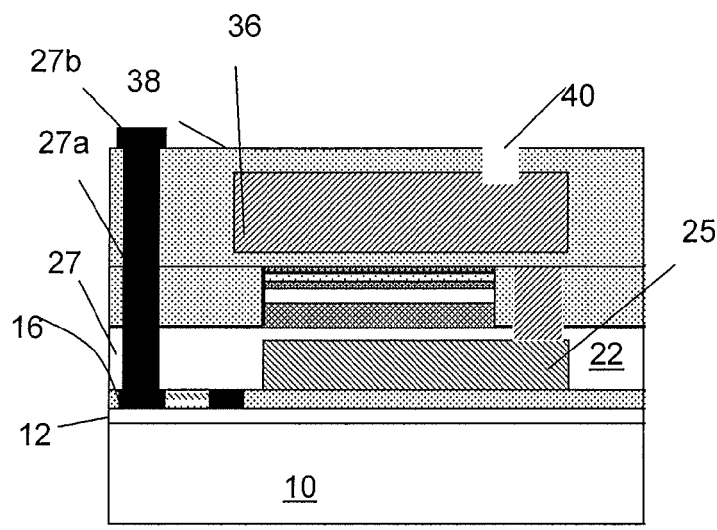

In FIG. 8, a lid material 38 is formed over the sacrificial material 36. In embodiments, the lid material 38 is silicon dioxide and is planarized using CMP. A metal or metal alloy interconnect 27a is formed in the lid material 38 and the insulator material 32, in contact with the interconnect 27. In embodiments, the interconnect 27a can be formed in any conventional CMOS process. For example, a mask can be formed on the lid material 38, and exposed to light to form a pattern. An etching process can then be performed, to form a pattern in the lid material 38 and the insulator material 32. The pattern (opening) is then filled with a metal or metal alloy such as, for example, a aluminum based material. Alternatively, the trench is filled with a metal such as, for example, thin TiN followed by thick tungsten and damascene CMP, as is known in the art. An upper wiring layer 27b can be formed in contact with the interconnect 27a, by a conventional metal deposition and patterning process as is known in the art. For example, the upper wiring layer 27b may be, for example, formed using a damascene copper or subtractive-etch aluminum copper.

As further shown in FIG. 8, a vent hole 40 is formed in the lid material 38, exposing a portion of the sacrificial material 36, e.g., sacrificial silicon material. The vent hole 40 can be formed during or after trench formation of the interconnect 27a. It should be understood that more than one vent hole 40 can be formed in the lid material 38. The vent hole 40 can be formed using conventional lithographic and etching processes known to those of skill in the art. The width and height of the vent hole 40 determines the amount of material that should be deposited after silicon venting to pinch off the vent hole. In general, the amount of material that should be deposited to pinch off the vent hole 40 decreases as the vent hole width decreases; and as the vent hole aspect ratio, which is the ratio of the vent hole height to width, increases. In embodiments, for example, the vent hole 40 is about 3 μm tall and 1 μm wide; although other dimensions are also contemplated by the present invention. In embodiments, the vent hole 40 may be circular or nearly circular, to minimize the amount of subsequent material needed to pinch it off.

Figure 9:
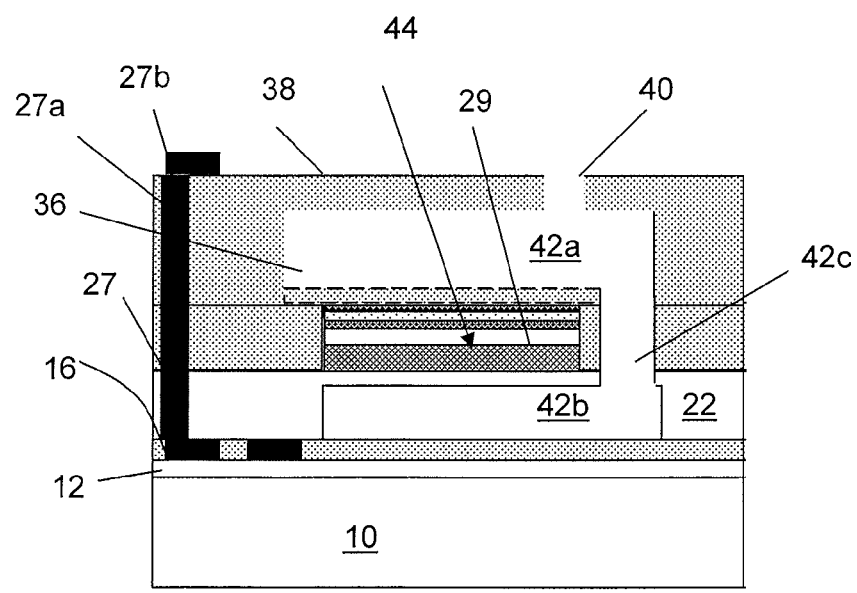

As shown in FIG. 9, the vent hole 40 is used to form an upper cavity 42a and a lower cavity 42b in a single venting process. More specifically, the vent hole 40 provides access for venting (e.g., etching) the sacrificial silicon material 36 and sacrificial silicon material 25, underneath the amorphous beam structure 44 (e.g., layers 29, 22, 24, 26 and 28 (with oxide film)), through venting via 42c. In embodiments, the exposed silicon or upper cavity material 36 is cleaned of native oxide and hydrogen passivated using a hydrofluoric acid clean followed by silicon venting or etching using a $XeF_2$ etchant through the vent hole 40, which will strip all of the exposed silicon material. The oxide material 32 can be used to protect the beam structure 44 and its constituent layers (e.g., layers 29, 31, 22, 24, 26 and 28) during the venting process. In embodiments, the oxide material can be about 100 nm over the beam structure 44 to prevent silicon reaction with aluminum nitride PZT film and/or Molybdenum or other materials contacting the PZT film 26.

In embodiments, the venting will form the upper cavity 42a and the lower cavity 42b, which surrounds the beam structure 44. The upper cavity 42a and the lower cavity 42b can be about 2 μm; although other dimensions are also contemplated by the present invention. In embodiments, the beam 44 comprises the amorphous silicon material 29 surrounded by oxide material and its constituent layers 31, 24, 26, 28. In embodiments, the structure, and in particular, the exposed sacrificial material 36, can be cleaned with an HF solution prior to venting to remove the native oxide. It should also be understood by those of ordinary skill that the interconnect 27a can be formed prior to or after the formation of the cavities 42a, 42b, by conventional photolithographic, etching and deposition processes, i.e., etching a trench through layers 38 and 32, and depositing a metal therein, as discussed above.

Figure 10:
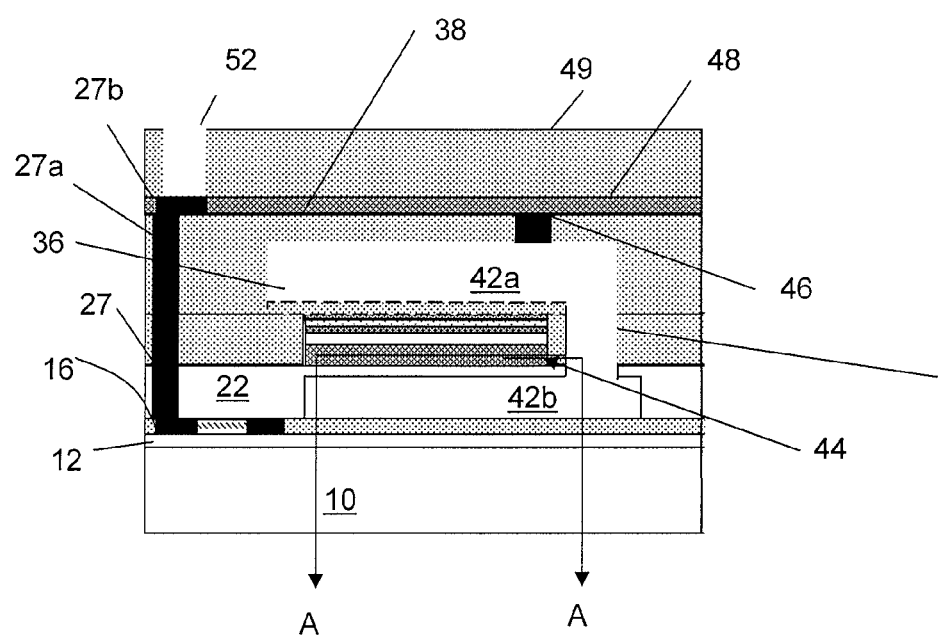

As shown in FIG. 10, the vent hole can be sealed with a material 46, such as a dielectric or metal. This will provide a hermetic seal to the upper cavity 42a and the lower cavity 42b. An optional layer 48 can also be deposited to provide a hermetic seal such as, for example, a 500 nm PECVD silicon nitride film or other films known to provide a hermetic seal over material 46.

FIG. 10 further shows back end of the line processes in accordance with aspects of the present invention. More specifically, FIG. 10 shows a final via 52 formed in an upper layer 49, deposited on the lid material 38 or optional layer 48. In this embodiment, the upper layer 48 can be an insulator material. The final via 52 is in alignment with the upper wiring 27b and can be formed using any conventional photolithographic and etching processes. In embodiments, the final via 52 can be formed by etching a trench into the upper optional layer 48 and upper layer 49, as is known in the art. The final via 52 may be provided for wirebond or solder bump processing.

Figure 11:
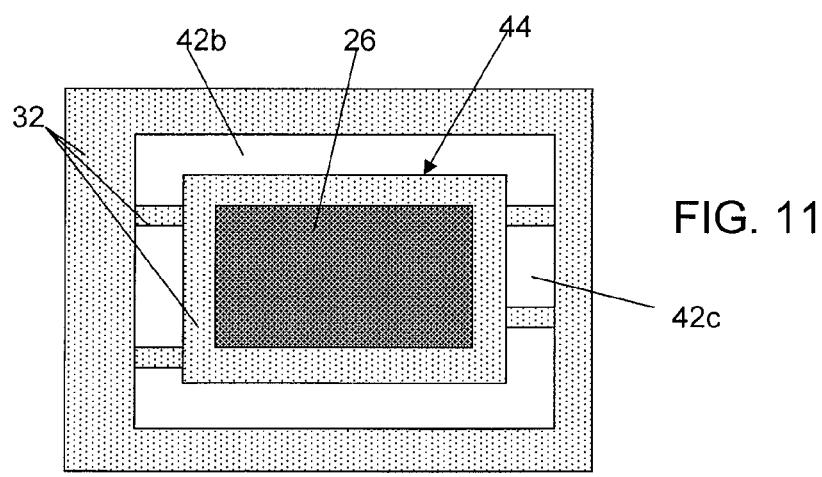
FIG. 11 shows a top view of a structure in accordance with aspects of the present invention, along line A-A of FIG. 10.

FIG. 11 shows a top view of a structure in accordance with the present invention corresponding to FIG. 10, along line A-A of FIG. 10. More specifically, FIG. 11 shows a cross sectional view, from the top, of the structure of FIG. 10, along line A-A. This top view shows the beam structure 44, with PZT film 26 formed on a metal layer and, more specifically, over the oxide material 32. In embodiments, the oxide material 32 is over the beam structure 44 to prevent silicon reaction with aluminum nitride PZT film and/or Molybdenum or other materials contacting the PZT film 26. Also, as shown in this top view, the lower cavity 42b is formed under the beam structure 44, during the venting step. In embodiments, a venting via 42c is formed between the lower cavity 42b and the upper cavity (not shown) during the venting, in order to form the lower cavity 42b.

Figure 12A:
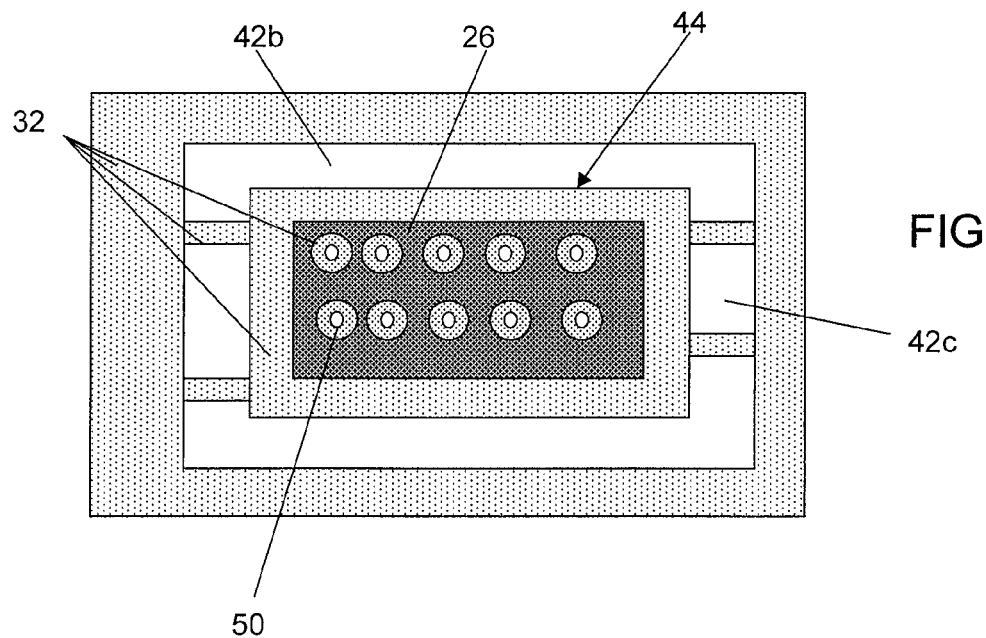
FIG. 12*a* shows a top view of an alternative structure in accordance with an aspect of the present invention.
Figure 12B:
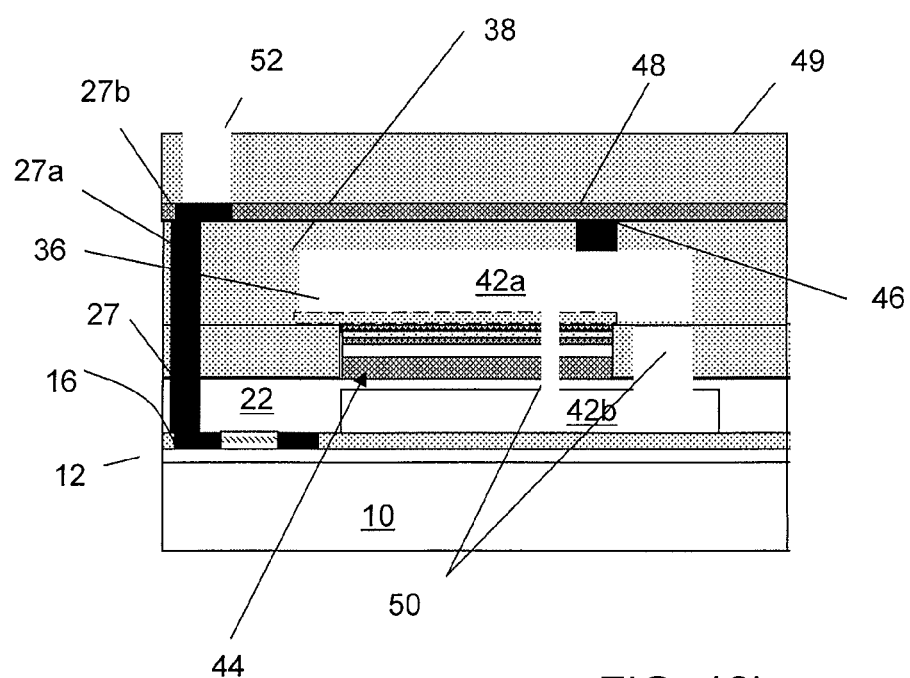
FIG. 12*b* shows a side view of the structure of FIG. 12*a* in accordance with aspects of the present invention.

FIG. 12a shows a top view of an alternative structure in accordance with an aspect of the present invention, and FIG. 12b shows a side view of the structure of FIG. 12a. In this structure, cavities 50 are formed on the side of the beam 44, as well as through the beam 44, in order to assist in the formation of the lower cavity 42b. More specifically, through a conventional etching process, cavities 50 can be formed through the beam 44 and on the side of the beam 44, as described above. The cavities 50 can be lined with an insulator material such as, for example, the oxide material 32 that coats other structures of the present invention. As already described herein, the oxide material 32 will prevent silicon reaction with aluminum nitride PZT film and/or Molybdenum or other materials contacting the PZT film 26, during the venting process for example.

In the process flow, the cavities 50 can be formed after the formation of the beam structure 44, e.g., during the formation processes of FIG. 6. For example, a via or trench can be formed in the beam structure, and then filled with an oxide material (e.g., similar to that described in FIG. 6. The cavities 50 can then be formed within the oxide material during, for example, the processes of FIG. 6. A silicon material can then be deposited in the cavities 50 (now lined with the oxide material) during the processes of FIG. 7, which will then be vented during subsequent venting processes described herein.

Figure 13:
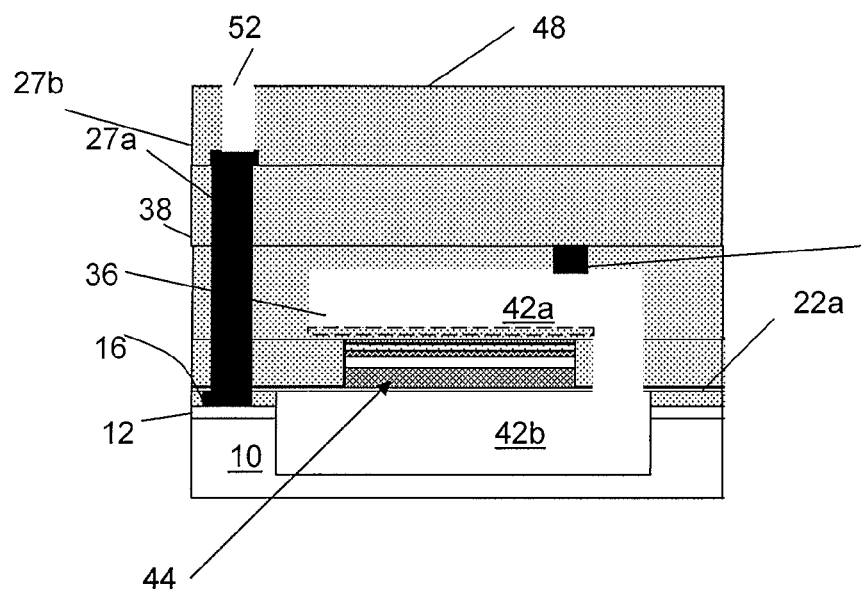
FIG. 13 shows an alternative structure and respective processing steps in accordance with aspects of the present invention.

FIG. 13 shows an alternative structure and processing steps in accordance with aspects of the present invention. In this structure, the amorphous beam structure 44 is fabricated on a thin layer of oxide 22a formed on the active silicon layer 14. The oxide layer 22a can be formed by any conventional thermal deposition process such as, for example, a chemical vapor deposition (CVD) process. In embodiments, the thin layer of oxide 22a can have a thickness of about 0.1 to 5 microns; although other dimensions are also contemplated by the present invention. The lower cavity 42b is formed in the wafer 10 by conventional etching steps, as discussed above. For example, the lower cavity 42b can be formed during the same etching process that forms the upper cavity 42a. Also, as in the embodiments shown in FIGS. 12a and 12b, the lower cavity 42b can be formed through one or more vias, on the side of the amorphous silicon beam 44, through the amorphous silicon beam 44 or any combination thereof. Also, the amorphous silicon beam 44 can be coated with a thin oxide layer, as described above.

Figure 14:
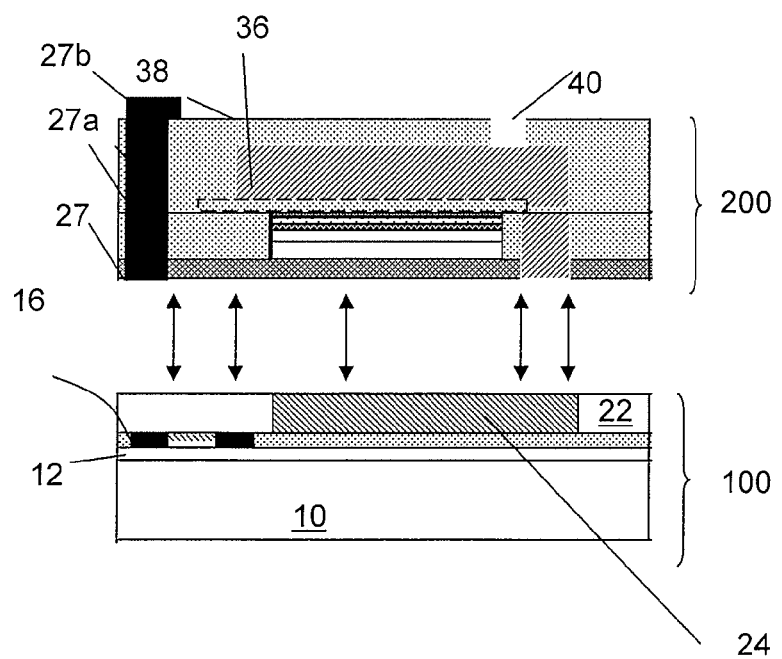
FIG. 14 show alternative processing steps in accordance with aspects of the present invention.

FIG. 14 shows alternative processing steps for forming a structure in accordance with aspects of the present invention. In this alternative process, the bottom portion 100 and top portion 200 portion of the structure are formed separately, and then bonded together. Once the bottom portion 100 and top portion 200 are bonded together, the processes starting at FIG. 9 can commence, in order to form the upper cavity 42a and lower cavity 42b. In embodiments, the vent hole 40 can be formed prior to or after the bonding processes. In still another alternative process, the upper cavity 42a and lower cavity 42b can be formed prior to the bonding. In this alternative structure, the sacrificial material 25 forming the lower cavity 42b can be etched using conventional CMOS processes.

Figure 15:
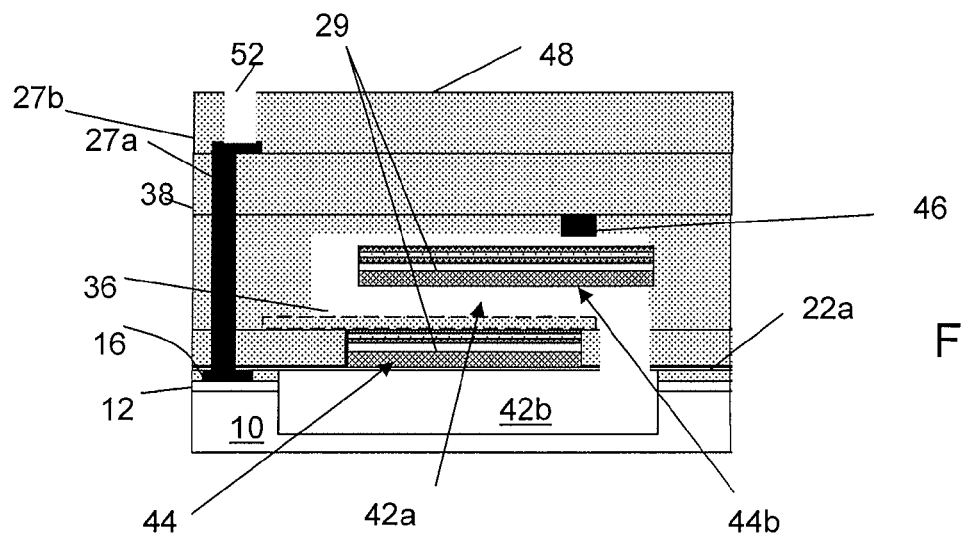
FIGS. 15-18 show alternative structures and respective processing steps in accordance with aspects of the present invention.
Figure 16:
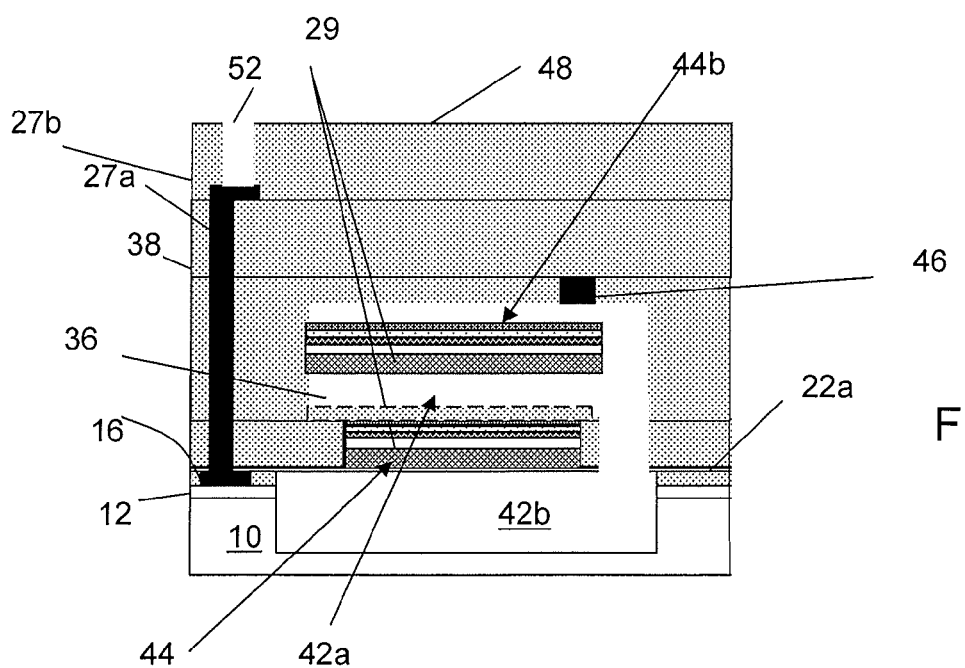
Figure 17:
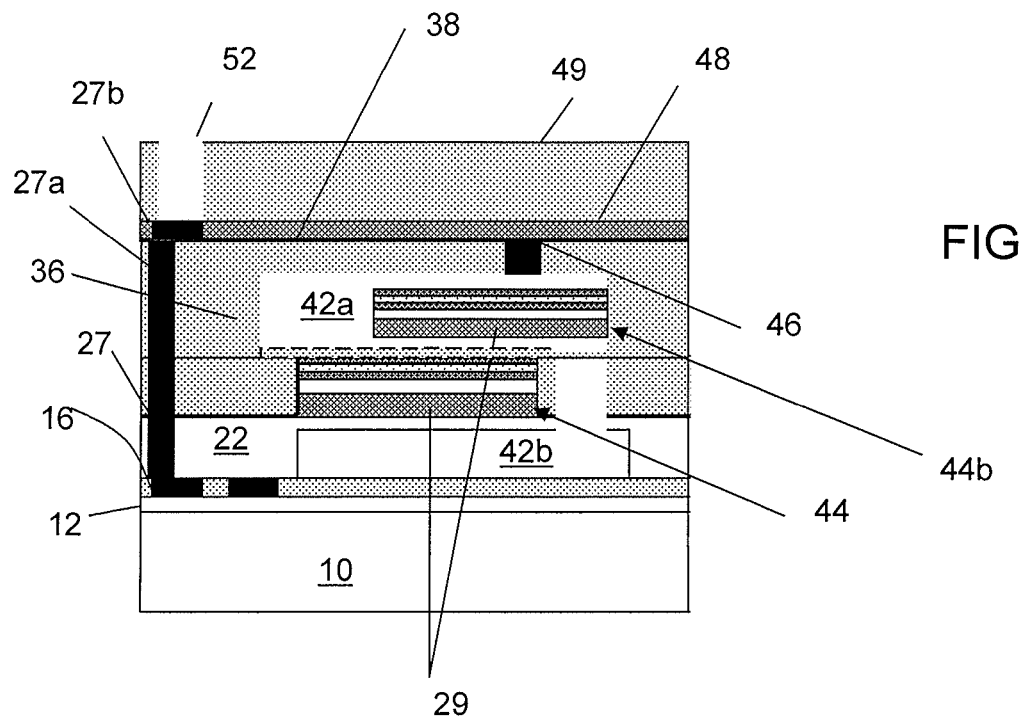
Figure 18:
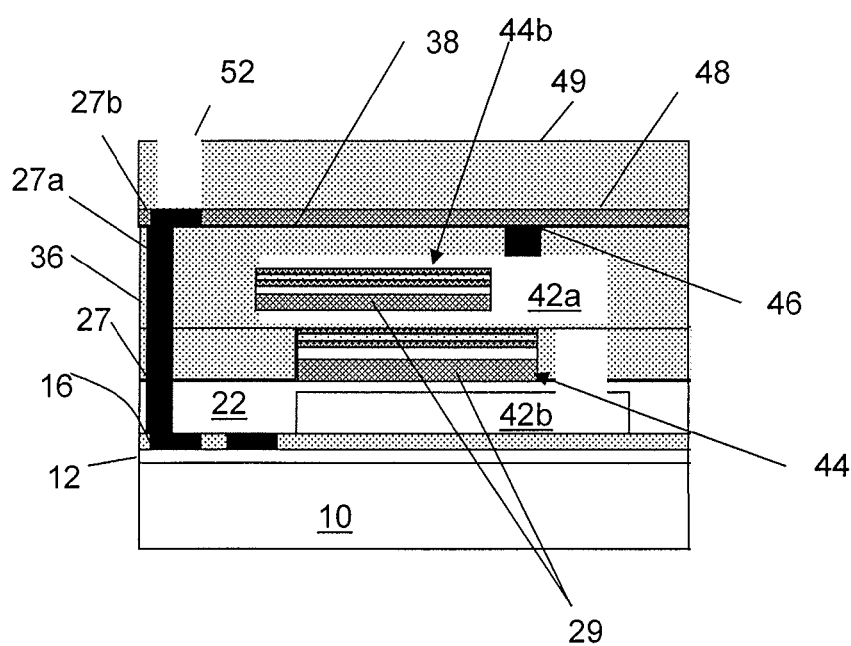

FIGS. 15-18 show alternative structures and respective processing steps in accordance with the present invention. More specifically, FIGS. 15-18 show the formation of two beam structures 44 and 44b, both with an amorphous silicon material 29. The beam structure 44b can be formed in the same manner as beam 44. In the embodiments of FIGS. 15 and 16, the lower cavity 42b is provided in the substrate 10;

whereas FIGS. 17 and 18 show the lower cavity 42*b* is formed in the insulator material 22. In FIGS. 15 and 17, the beams 44 and 44*b* are opposing beam structures formed on different sidewalls of the upper cavity 42*a*. In FIGS. 16 and 18, the beams 44 and 44*b* extend from the same side of the upper cavity 42*a*.

Figure 19:
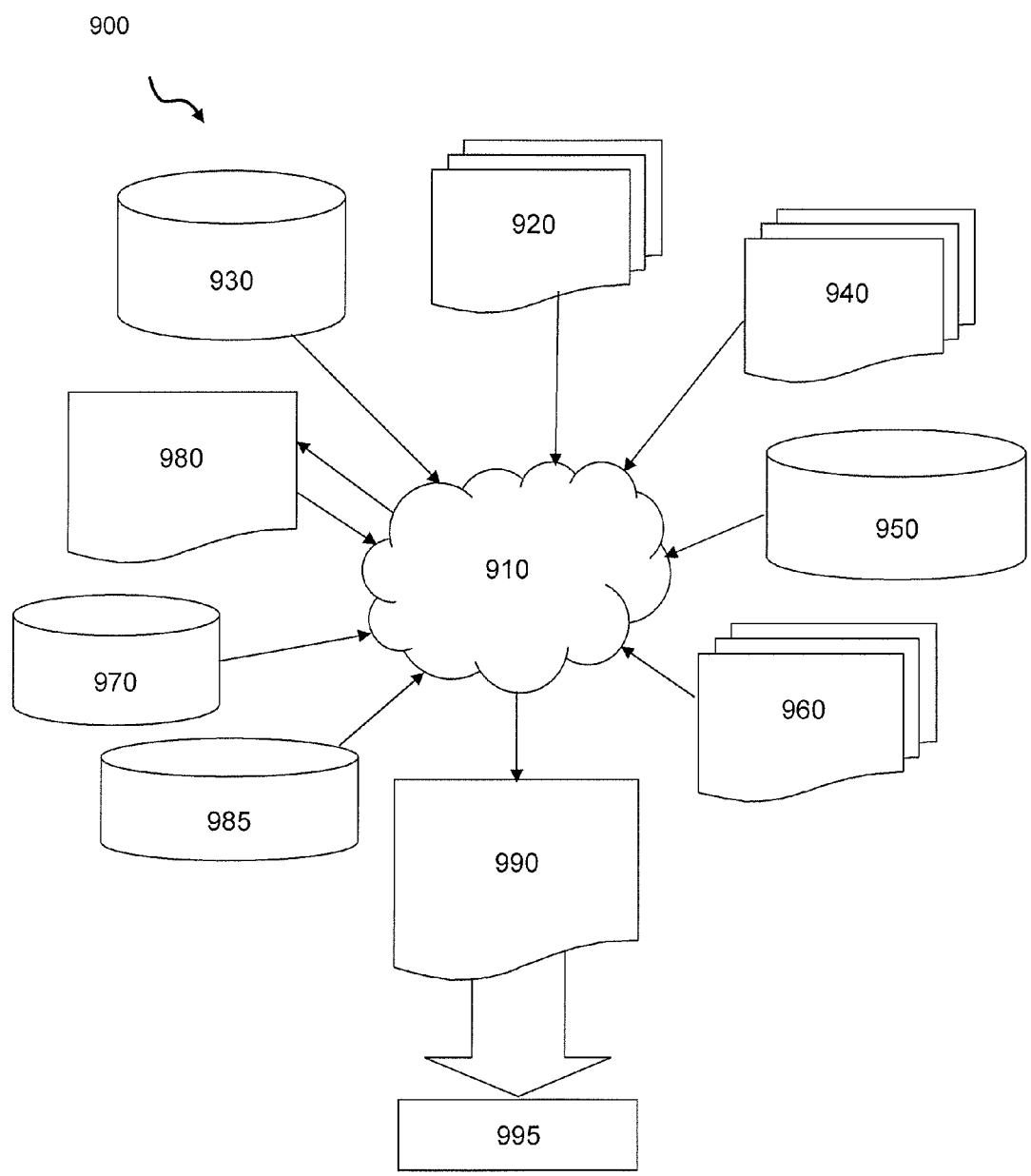
FIG. 19 is a flow diagram of a design process used in semiconductor design, manufacture, and/or test.

FIG. 19 is a flow diagram of a design process used in semiconductor design, manufacture, and/or test. FIG. 19 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-5*a*, 5*b*, 6-12*a*, and 12*b*-18. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example, a programmable gate array (PGA) or a field programmable gate array (FPGA) offered by Altera® Inc. or Xilinx® Inc.

FIG. 19 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-5*a*, 5*b*, 6-12*a*, and 12*b*-18. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-5*a*, 5*b*, 6-12*a*, and 12*b*-18 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-5*a*, 5*b*, 6-12*a*, and 12*b*-18. In one embodiment, design structure 990 may comprise a compiled, executable HDL simulation model that functionally simulates the devices shown in FIGS. 1-5*a*, 5*b*, 6-12*a*, and 12*b*-18.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-5*a*, 5*b*, 6-12*a*, and 12*b*-18. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. The corresponding structures, materials, acts, and equivalents of all means or step plus function elements in the claims, if applicable, are intended to include any structure, material, or act for performing the function in combination with other claimed elements as specifically claimed. Accordingly, while the invention has been described in terms of embodiments, those of skill in the art will recognize that the invention can be practiced with modifications and in the spirit and scope of the appended claims.

What is claimed:

1. A method, comprising:
   forming an amorphous silicon beam over an SOI substrate;
   protecting the amorphous silicon beam with an insulator material during cavity formation, wherein:
   the cavity formation comprising forming an upper cavity above the amorphous silicon beam and a lower cavity below the amorphous silicon beam;
   the upper cavity is formed by venting a sacrificial material formed over the amorphous silicon beam; and
   the lower cavity is formed by venting underlying material, below the amorphous silicon beam through a via connecting the upper cavity and the lower cavity.

2. The method of claim 1, wherein the lower cavity is formed in an insulator layer below above the amorphous silicon beam.

3. The method of claim 2, wherein the insulator material coats and protects exposed portions of the amorphous silicon beam during the venting of the upper cavity and the lower cavity.

4. The method of claim 1, wherein the upper cavity is formed in an insulator layer formed above the amorphous silicon beam, and the lower cavity is formed in an SOI substrate below a BOX layer and the amorphous silicon beam.

5. The method of claim 1, further comprising:
   forming one or more devices in an active layer of the SOI substrate, separated from the amorphous silicon beam by an isolation layer; and
   forming a Bulk Acoustic Wave (BAW) filter or Bulk Acoustic Resonator (BAR) in electrical connection with at least one of the one or more devices.

6. The method of claim 1, further comprising forming an insulator layer between the amorphous silicon beam and an underlying substrate material.

7. The method of claim 6, wherein:
   the forming of the amorphous silicon beam comprises:
      forming an amorphous silicon material on an insulator layer; and
      forming layers of metal and piezoelectric material over the amorphous silicon material; and
   the forming of the metal layers and piezoelectric material comprises:
      depositing a first metal layer over an insulator layer formed on the amorphous silicon beam;
      depositing the piezoelectric material on the first metal layer;
      depositing a second metal layer on the piezoelectric material; and
      patterning of the first metal layer, the piezoelectric material and the second metal layer.

8. The method of claim 7, further comprising forming a trench through the amorphous silicon material, the first metal layer, the piezoelectric material, the second metal layer and the insulator layer, and the insulator material is formed within the trench and over exposed portions of at least the amorphous silicon material, the first metal layer, the piezoelectric material and the second metal layer.

9. The method of claim 1, wherein the insulator material is oxide deposited using high density plasma or plasma enhanced high density plasma processes or low pressure chemical vapor deposition (CVD) processes.

10. A method comprising:
    forming at least one beam comprising amorphous silicon material;
    providing an insulator material over and adjacent to the amorphous silicon beam;
    forming a via through the insulator material and exposing a material underlying the amorphous silicon beam;
    providing a sacrificial material in the via and over the amorphous silicon beam;
    providing a lid on the sacrificial material and over the insulator material; and venting, through the lid, the sacrificial material and the underlying material to form an upper cavity above the amorphous silicon beam and a lower cavity below the amorphous silicon beam, respectively.

11. The method of claim 10, wherein:
the underlying material is a sacrificial silicon material buried in an insulator layer formed over an active semiconductor layer;
the sacrificial silicon material is substantially under the amorphous silicon material;
the amorphous silicon material is formed on the insulator layer; and
the lower cavity is formed by venting out the sacrificial silicon material buried in the insulator layer.

12. The method of claim 10, wherein:
the underlying material is a wafer;
the via extends to the wafer; and
the lower cavity is formed by etching into the wafer underneath the amorphous beam.

13. The method of claim 10, further comprising forming one or more devices in an active silicon layer, below the amorphous silicon beam.

14. The method of claim 13, further comprising forming a Bulk Acoustic Wave (BAW) filter or Bulk Acoustic Resonator (BAR) in electrical connection with at least one of the one or more devices.

15. The method of claim 10, wherein:
forming the amorphous silicon beam comprises:
    forming layers of metal and piezoelectric material over the amorphous silicon material; and
    patterning the amorphous silicon material and the layers of metal and piezoelectric material; and
the forming of the metal layers and piezoelectric material comprises:
    depositing a first metal layer over an insulator layer on the amorphous silicon beam;
    depositing the piezoelectric material on the first metal layer; and
    depositing a second metal layer on the piezoelectric material.

16. The method of claim 15, wherein:
forming the lower cavity comprises forming at least one trench through the amorphous silicon material, the first metal layer, the piezoelectric material, the second metal layer and an insulator layer under and over the amorphous silicon material, and venting the underlying material; and
the insulator material lines exposed portions of at least the amorphous silicon material, the first metal layer, the piezoelectric material, the second metal layer.

17. The method of claim 10, wherein:
the insulator material is patterned using a reverse mask and RIE process prior to the forming of the via;
the insulator material undergoes a chemical mechanical polish (CMP) with an optional oxide deposition process prior to forming the via; and
forming the via comprises etching of the insulator material such that sidewalls of the via and exposed portions of the amorphous silicon beam remain coated in the insulator material.

18. The method of claim 10, wherein the venting comprises forming a vent hole in the lid, etching of the sacrificial material and underlying material using a $XeF_2$ etchant through the vent hole, which will strip all of the exposed sacrificial material and the underlying material, and plugging the vent hole after the formation of the upper cavity and the lower cavity.

19. The method of claim 18, wherein the insulator material protects the amorphous silicon beam and any constituent layers during the venting.

20. The method of claim 10, wherein the upper cavity and the lower cavity are formed in a single venting step.

21. The method of claim 10, wherein the forming at least one beam is at least two beams formed in the upper cavity.

* * * * *